United States Patent [19]
Finol et al.

[11] Patent Number: 5,920,810
[45] Date of Patent: Jul. 6, 1999

[54] MULTIPLIER AND METHOD FOR MIXING SIGNALS

[75] Inventors: Jesus Lucidio Finol, Gilbert; Michael J. McGowan; Philippe Gorisse, both of Mesa, all of Ariz.

[73] Assignee: Motorola, Inc., Schaumburg, Ill.

[21] Appl. No.: 08/851,236

[22] Filed: May 5, 1997

[51] Int. Cl.$^6$ ............................................. H04B 1/26
[52] U.S. Cl. ..................... 455/313; 455/323; 455/326; 455/322; 327/356; 327/357; 327/359
[58] Field of Search ................................ 327/356, 357, 327/359, 116, 119, 122; 455/323, 326, 322, 332, 333, 337, 313

[56] References Cited

U.S. PATENT DOCUMENTS

| | | | |
|---|---|---|---|
| 5,222,016 | 6/1993 | Matsumoto et al. | 363/157 |
| 5,517,688 | 5/1996 | Fajan et al. | |
| 5,578,961 | 11/1996 | Fajan et al. | 327/543 |
| 5,774,020 | 6/1998 | Kimura | 330/252 |
| 5,826,182 | 10/1998 | Gilbert | 455/326 |

OTHER PUBLICATIONS

*1996 IEEE International Solid–State Circuits Conference Digest of Technical Papers*, First Edition, Feb. 1996, IEEE Catalog No. 96CH35889, John H. Wuorinen, Castine, ME 04221, TP 3.1: "A.1.5V 900 Mhz Downconversion Mixer", Behzad Razavi, pp. 48–49.
*1996 IEE International Solid State Circuits Conference Digest of Technical Papers*, First Edition Feb. 1996, IEEE Catalog No. 96CH35889, John H. Wuorinen, Castine, ME 04421, SP 21.5: "A 0.9V 1.2mA 200Mhz BICMOS Single–Chip Narrow–Band FM Receiver", Matthijs Pardoen, John Gerrits, Vincent von Kaenel, pp. 348–349.
*1994 IEEE International Solid–State Circuits Conference Digest of Technical Papers*, First Edition, Feb. 1994, IEEE Catalog No. 94CH3410–8, Joyhn H. Wuorinen, Castine, ME 04421; WP 2.6: "A 2V 2Ghz Si–Bipolar Direct–Conversion Quadrature Modulator", Tsuneo Tsukahara, Masayuki Ishikawa, Masahiro Muraguchi, pp. 40–41.

*Primary Examiner*—Wellington Chin
*Assistant Examiner*—Sheila Smith
*Attorney, Agent, or Firm*—Rennie William Dover

[57] ABSTRACT

A multiplier (10) includes a transconductor (14) and a multiplier core (34). The transconductor (14) converts an RF voltage signal to an RF current signal. The RF current signal modulates the quiescent currents flowing in current conducting elements (23, 24), thereby generating a modulated current signal. The modulated current signal is transmitted to the multiplier core (34), where it is combined with an LO signal to generate an output signal. The transconductor (14) and the multiplier core (34) have their current conduction paths separated from each other by the current conducting elements (23, 24).

19 Claims, 3 Drawing Sheets

MULTIPLIER AND METHOD FOR MIXING SIGNALS

BACKGROUND OF THE INVENTION

The present invention relates, in general, to semiconductor circuits and, more particularly, to multiplier circuits.

Multiplier circuits are well known in communication applications. A multiplier combines a radio frequency (RE) signal and a local oscillator (LO) signal to generate a mixed signal, which has a spectrum comprised of the sum and difference of the frequencies of the RF and LO signals. If the high frequency components of the mixed signal are filtered out, the output signal of the multiplier is usually an intermediate frequency (IF) signal.

A Gilbert multiplier is widely used as a multiplier circuit because of its good performance parameters, such as small intermodulation product distortions, low noise figures, etc. A large current bias to a Gilbert multiplier with an emitter degeneration resistor improves the linearity of the Gilbert multiplier. The voltage swing of the output signal of the Gilbert multiplier is proportional to the current bias. A large current bias also results in a large voltage swing. In addition, a conventional Gilbert multiplier includes a cross-coupled pair and an emitter-coupled pair serially coupled between two supply voltage levels. The emitter degeneration resistor, the large voltage swing, the serial coupling of the cross-coupled pair and the emitter-coupled pair require a high supply voltage for the Gilbert multiplier to operate properly. Therefore, a conventional Gilbert multiplier is not suitable for use in low voltage applications.

Accordingly, it would be advantageous to have a multiplier and a method for mixing signals. It is desirable for the multiplier and the method to be suitable for use in low voltage applications. It is also desirable for the multiplier to have good signal isolation.

BRIEF DESCRIPTION OF THE DRAWINGS

It should be noted the same reference numerals are used in the figures to represent elements of similar structure and function.

DETAILED DESCRIPTION OF THE DRAWINGS

Generally, the present invention provides a multiplier and a method for mixing signals. The multiplier includes a radio frequency (RF) port and a local oscillator (LO) port. A transconductor coupled to the RF port converts an RF voltage signal to an RF current signal. The RF current signal modulates a quiescent current flowing in a current conducting element. The modulated current signal, which has the same frequency as the RF signal, is transmitted to a multiplier core, where it is combined with an LO signal at the LO port to generate an output signal. The output signal has a spectrum comprised of the sum and difference of the frequencies of the RF and LO signals. In accordance with the present invention, the transconductor and the multiplier core have their current conduction paths separated from each other. The currents flowing in the transconductor and the multiplier core can be individually adjusted to optimize the performance of the multiplier. More particularly, a large current bias can be provided to the transconductor to improve the linearity of the multiplier without increasing the voltage swing of the output signal and/or raising a supply voltage to the multiplier. Therefore, the multiplier is suitable for use in low voltage applications. Further, separate current conduction paths for the transconductor and the multiplier core improve the signal isolation between the RF and LO ports.

Figure 1:
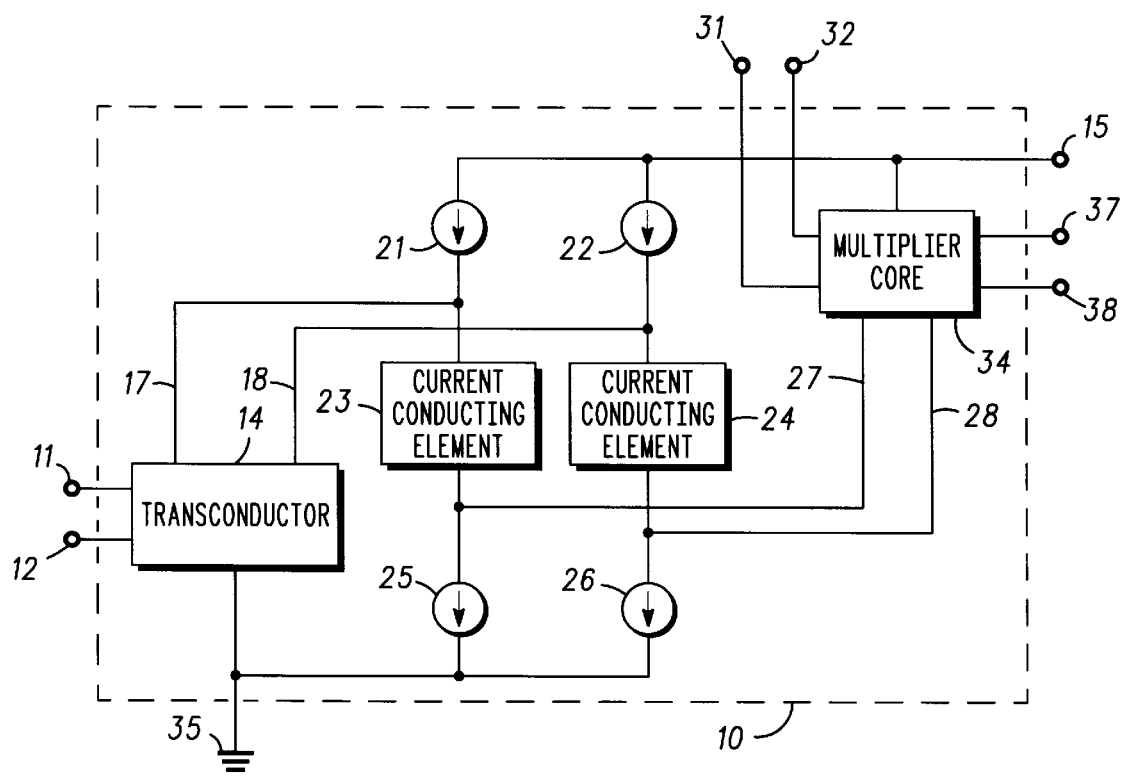
FIG. 1 is a block diagram of a multiplier in accordance with the present invention.

FIG. 1 is a block diagram of a multiplier 10 in accordance with the present invention. Multiplier 10 combines a differential RF input signal at input terminals 11 and 12 and a differential LO input signal at input terminals 31 and 32 to generate a differential output signal at output terminals 37 and 38. Thus, input terminals 11 and 12 form an RF port or a pair of differential RF input terminals, input terminals 31 and 32 form an LO port or a pair of differential LO input terminals, and output terminals 37 and 38 form an output port or a pair of differential output terminals. Depending on the amplitude of the RF signal at RF input terminals 11 and 12 and the amplitude of the LO signal at LO input terminals 31 and 32, multiplier 10 can operate as an analog multiplier, a modulator/demodulator, or a phase detector.

Multiplier 10 includes a transconductor 14 having a pair of inputs connected to RF input terminals 11 and 12. Transconductor 14 also has a pair of outputs 17 and 18. Transconductor 14 converts a differential RF voltage signal at RF input terminals 11 and 12 into a differential RF current signal at outputs 17 and 18.

Multiplier 10 also includes current sources 21 and 22, current conducting elements 23 and 24, and current sinks 25 and 26. A first terminal of current conducting element 23 is connected to current source 21 and to output 17 of transconductor 14. A second terminal of current conducting element 23 is connected to current sink 25. A first terminal of current conducting element 24 is connected to current source 22 and to output 18 of transconductor 14. A second terminal of current conducting element 24 is connected to current sink 26. The differential RF current signal at outputs 17 and 18 of transconductor 14 modulates the currents flowing in current conducting elements 23 and 24, thereby generating a differentially modulated current signal.

Multiplier 10 further includes a multiplier core 34 having a first pair of inputs 27 and 28 connected to the second terminals of current conducting elements 23 and 24, respectively, a second pair of inputs connected to LO input terminals 31 and 32 of multiplier 10, and a pair of outputs connected to output terminals 37 and 38 of multiplier 10. Multiplier core 34 combines the differentially modulated current signal at inputs 27 and 28 with a differential LO input signal at LO input terminals 31 and 32 to generate the differential output signal at output terminals 37 and 38.

Power is supplied to multiplier 10 via voltage supply conductors 15 and 35. As shown in FIG. 1, multiplier 10 has six current conduction paths established between voltage supply conductors 15 and 35. The first current conduction path goes through current source 21 and transconductor 14. The second current conduction path goes through current source 22 and transconductor 14. The third current conduction path goes through current source 21, current conducting element 23, and current sink 25. The fourth current conduction path goes through current source 22, current conducting element 24, and current sink 26. The fifth current conduction path goes through multiplier core 34 and current sink 25. The sixth current conduction path goes through multiplier core 34 and current sink 26.

The currents flowing through transconductor 14 and multiplier core 34 are independent from each other and can be individually adjusted to optimize the performance of multiplier 10. Unlike a conventional Gilbert multiplier, a larger current bias supplied to transconductor 14 does not necessarily increase the voltage swing of the output signal at output terminals 37 and 38. The supply voltage of transconductor 14 depends on the supply voltage to multiplier 10 at voltage supply conductors 15 and 35 and the voltage drop across current sources 21 and 22. Likewise, the supply voltage of multiplier core 34 depends on the supply voltage to multiplier 10 at voltage supply conductors 15 and 35 and the voltage drop across current sinks 25 and 26. Unlike the conventional Gilbert multiplier, in which a cross-coupled pair and an emitter-coupled pair are serially coupled between the voltage supply conductors, the supply voltages of both transconductor 14 and multiplier core 34 can be individually adjusted. More particularly, transconductor 14 and multiplier core 34 can be biased with voltage values only slightly lower than the supply voltage across voltage supply conductors 15 and 35. Therefore, multiplier 10 can operate with a low supply voltage such as, for example, a supply voltage as low as approximately 1.8 volts. In other words, multiplier 10 is suitable for use in low voltage applications. In addition, the current conduction paths of transconductor 14 and the current conduction paths of multiplier core 34 are separated from each other by current conducting elements 23 and 24, and the biasing of transconductor 14 and the biasing of multiplier core 34 are independent from each other. Therefore, the signal isolation between the RF and LO ports is significantly improved over the signal isolation between the RF and LO ports in the conventional Gilbert multiplier.

Figure 2:
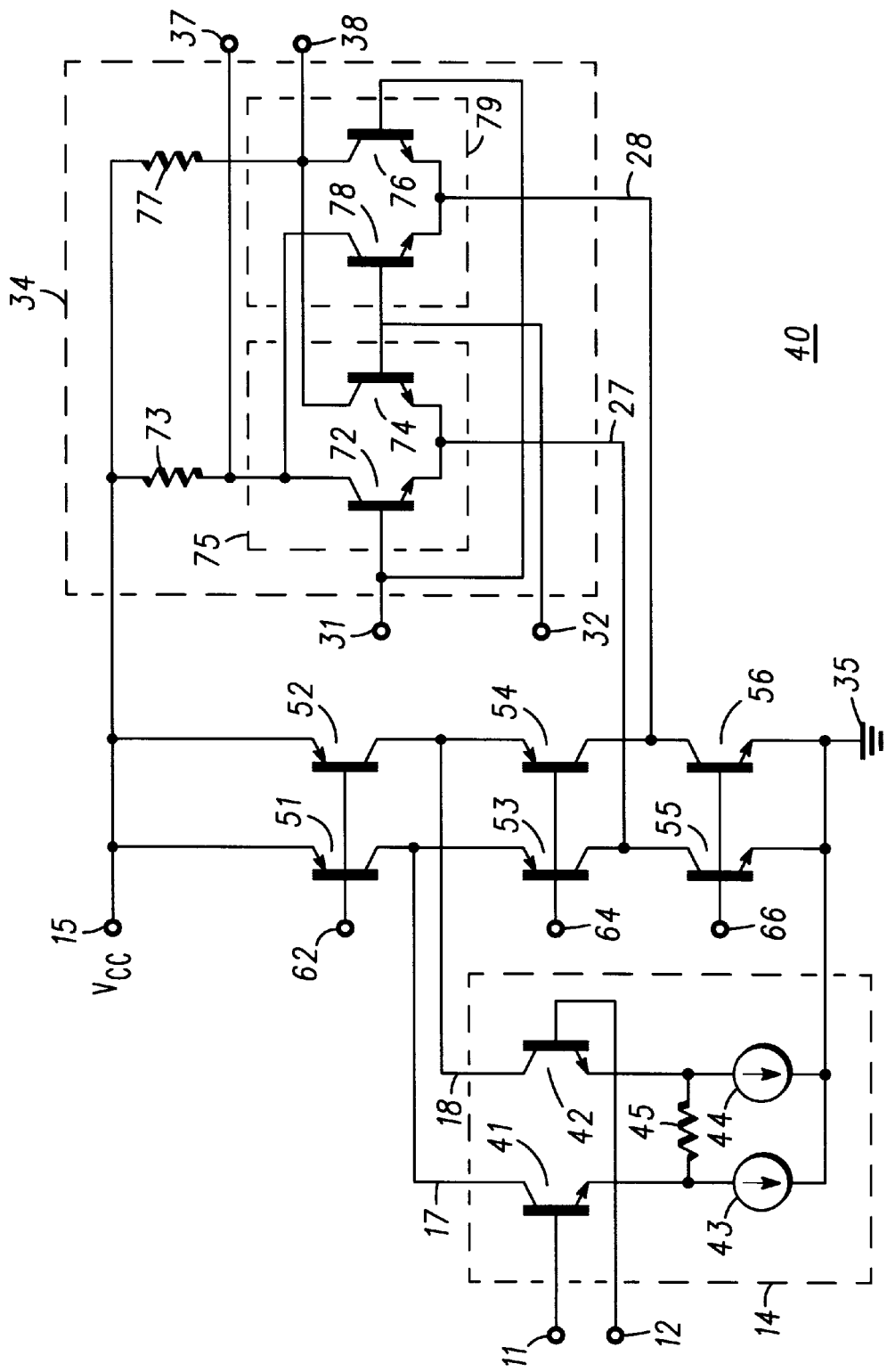
FIG. 2 is a schematic diagram of a multiplier in accordance with an embodiment of the present invention.

FIG. 2 is a schematic diagram of a multiplier 40 in accordance with an embodiment of the present invention. Like multiplier 10 shown in FIG. 1, multiplier 40 combines a differential RF input signal at a pair of differential RF input terminals 11 and 12 and a differential LO input signal at a pair of differential LO input terminals 31 and 32 to generate a differential output signal at a pair of differential output terminals 37 and 38. Multiplier 40 can operate as an analog multiplier such as an upconverter or a downconverter. Multiplier 40 can also operate as a modulator, a demodulator, or a phase detector.

Power is supplied to multiplier 40 via voltage supply conductors 15 and 35. By way of example, voltage supply conductor 15 is at an upper supply voltage level $V_{CC}$, and voltage supply conductor 35 is at a lower supply voltage level, e.g., ground voltage level. In low voltage applications, the upper supply voltage level $V_{CC}$ is typically between approximately 1.8 volts and approximately 3.3 volts.

Like multiplier 10 shown in FIG. 1, multiplier 40 includes a transconductor 14. Transconductor 14 is comprised of NPN bipolar transistors 41 and 42, current sinks 43 and 44, and a resistor 45. The base electrodes of transistors 41 and 42 serve as first and second inputs, respectively, of transconductor 14 and are connected to RF input terminals 11 and 12, respectively. The emitter electrodes of transistors 41 and 42 are coupled to voltage supply conductor 35 via current sinks 43 and 44, respectively. The collector electrodes of transistors 41 and 42 are connected to outputs 17 and 18, respectively, of transconductor 14. Resistor 45 has a first electrode connected to the emitter electrode of transistor 41 and a second electrode connected to the emitter electrode of transistor 42.

Transistors 41 and 42 form a differential pair. They are not limited to being bipolar transistors as shown in FIG. 2. For example, transistors 41 and 42 can be replaced by field effect transistors (FETs), insulated gate bipolar transistors, or the like. As those skilled in the art are aware, for a bipolar transistor, the base electrode serves as a control electrode, and the emitter and collector electrodes serve as current conducting electrodes. Current sinks 43 and 44 can be any kind of current source/sink circuit, such as, for example, bipolar transistors, field effect transistors, or the like. Preferably, the characteristics of transistors 41 and 42 match each other, and the characteristics of current sinks 43 and 44 match each other. Resistor 45 functions as an emitter degeneration resistor to increase the linearity of transconductor 14. It should be noted that emitter degeneration resistor 45 is optional in transconductor 14. The linearity of transconductor 14 can also be improved by using a predistortion circuit (not shown) to compensate for the nonlinear characteristics of transconductor 14.

Multiplier 40 also includes PNP bipolar transistors 51, 52, 53, and 54, and NPN bipolar transistors 55 and 56. The base electrodes of transistors 51 and 52 are connected to a biasing terminal 62 for receiving a biasing signal for transistors 51 and 52. The emitter electrodes of transistors 51 and 52 are connected to voltage supply conductor 15. The collector electrodes of transistors 51 and 52 are connected to outputs 17 and 18, respectively, of transconductor 14. The base electrodes of transistors 53 and 54 are connected to a biasing terminal 64 for receiving a biasing signal for transistors 53 and 54. The emitter electrodes of transistors 53 and 54 are connected to outputs 17 and 18, respectively, of transconductor 14. The base electrodes of transistors 55 and 56 are connected to a biasing terminal 66 for receiving a biasing signal for transistors 55 and 56. The emitter electrodes of transistors 55 and 56 are connected to voltage supply conductor 35. The collector electrodes of transistors 55 and 56 are connected to the collector electrodes of transistors 53 and 54, respectively.

Transistors 51, 52, 53, 54, 55, and 56 perform functions similar to those of current sources 21 and 22, current conducting elements 23 and 24, and current sinks 25 and 26, respectively, of multiplier 10 shown in FIG. 1. Preferably, the characteristics of transistors 52, 54, and 56 match the characteristics of transistors 51, 53, and 55, respectively. It should be noted that transistors 51, 52, 53, 54, 55, and 56 are not limited to being bipolar transistors as shown in FIG. 2, and they can be replaced by any kind of current source/sink circuit. For example, in an alternative embodiment of the present invention, transistors 51 and 52 are replaced by p-channel insulated gate FETs. In another alternative embodiment, transistors 53 and 54 are replaced by p-channel insulated gate FETs. In yet another alternative embodiment, transistors 55 and 56 are replaced by n-channel insulated gate FETs. It should be noted that, when some transistors, e.g., transistors 51 and 52, in multiplier 40 are replaced by FETs, other transistors, e.g., transistors 53, 54, 55, and 56, in multiplier 40 may either remain as bipolar transistors or be replaced by FETs.

Like multiplier 10 shown in FIG. 1, multiplier 40 further includes a multiplier core 34. Multiplier core 34 is comprised of NPN bipolar transistors 72, 74, 76, and 78, and resistors 73 and 77. Transistors 72 and 74 form a differential pair 75, and transistors 76 and 78 form a differential pair 79. The emitter electrodes of transistors 72 and 74 are connected together, forming a current biasing terminal of differential pair 75. The emitter electrodes of transistors 76 and 78 are connected together, forming a current biasing terminal of differential pair 79. The current biasing terminals of differential pairs 75 and 79 serve as the first pair of inputs 27 and 28, respectively, of multiplier core 34 and are connected to the collector electrodes of transistors 53 and 54, respectively. A base electrode of transistor 72 serves as a first input of differential pair 75 and is connected to LO input terminal 31. A base electrode of transistor 74 serves as a second input of differential pair 75 and is connected to LO input terminal 32. A collector electrode of transistor 72 serves as a first output of differential pair 75 and is connected to output terminal 37. A collector electrode of transistor 74 serves as a second output of differential pair 75 and is connected to output terminal 38. A base electrode of transistor 76 serves as a first input of differential pair 79 and is connected to LO input terminal 31. A base electrode of transistor 78 serves as a second input of differential pair 79 and is connected to LO input terminal 32. A collector electrode of transistor 76 serves as a first output of differential pair 79 and is connected to output terminal 38. A collector electrode of transistor 78 serves as a second output of differential pair 79 and is connected to output terminal 37. Resistor 73 has one electrode connected to the voltage supply conductor 15 and another electrode connected to output terminal 37. Resistor 77 has one electrode connected to the voltage supply conductor 15 and another electrode connected to output terminal 38.

Resistors 73 and 77 are current conducting elements that serve as loads to differential pairs 75 and 79. Resistor 73 combines the current signals in the collector electrodes of transistors 72 and 78, and converts the combined current signal to a voltage signal appearing at output terminal 37. Resistor 77 combines the current signals in the collector electrodes of transistors 74 and 76, and converts the combined current signal to a voltage signal appearing at output terminal 38. The voltage signals at output terminals 37 and 38 are two signal components of the differential output signal of multiplier 40. It should noted that resistors 73 and 77 are not limited to being resistors as shown in FIG. 2. They can be replaced by any kind of current source/sink circuit. It should also be noted that transistors 72, 74, 76, and 78 are not limited to being bipolar transistors. For example, they can be replaced by FETs.

In operation, transconductor 14 works as a differential amplifier which converts the differential RF voltage signal at RF input terminals 11 and 12 to a differential RF current signal in the collector electrodes of transistors 41 and 42. When the phase of the RF voltage signal is such that the voltage of the first signal component of the RF signal at RF input terminal 11 is higher than the voltage of the second signal component of the RF signal at RF input terminal 12, the current in the collector of transistor 41 is larger than the current in the collector of transistor 42.

Because the characteristics of transistors 51, 53, and 55 match those of transistors 52, 54, and 56, respectively, a quiescent current flowing in transistor 53 is substantially equal to a quiescent current flowing in transistor 54. The RF current signal of transconductor 14 modulates the quiescent currents in transistors 53 and 54. More particularly, when the current flowing in the collector of transistor 41 is larger than the current flowing in the collector of transistor 42 by a certain amount, the current flowing in transistor 53 is smaller than the current flowing in transistor 54 by substantially the same amount. The modulated currents in transistors 53 and 54 are two signal components of a modulated current signal transmitted to inputs 27 and 28 of multiplier core 34. The modulated current signal has the same frequency as the RF input signal.

Multiplier core 34 combines the modulated current signal at inputs 27 and 28 with the differential LO signal at LO input terminals 31 and 32 to generate a differential current signal in resistors 73 and 77. The phases of the currents flowing in resistors 73 and 77 are opposite to each other. The current flowing in resistor 73 develops a voltage drop across resistor 73, thereby generating a first signal component of the differential output signal of multiplier 40 at output terminal 37. Likewise, the current flowing in resistor 77 develops a voltage drop across resistor 77, thereby generating a second signal component of the differential output signal of multiplier 40 at output terminal 38.

As shown in FIG. 2, multiplier 40 has six direct current (DC) conduction paths established between voltage supply conductors 15 and 35. The first DC path goes through transistor 51, transistor 41, and current sink 43. The second DC path goes through transistor 52, transistor 42, and current sink 44. The third DC path goes through transistor 51, transistor 53, and transistor 55. The fourth DC path goes through transistor 52, transistor 54, and transistor 56. The fifth DC path goes through differential pair 75 and transistor 55. The sixth DC path goes through differential pair 79 and transistor 56.

The currents flowing through transconductor 14 and multiplier core 34 are independent from each other and can be individually adjusted to optimize the performance of multiplier 40. Unlike a conventional Gilbert multiplier, a larger current bias supplied to transconductor 14 does not necessarily increase the voltage swing of the output signal at output terminals 37 and 38. The supply voltage of transconductor 14 depends on the supply voltage to multiplier 40 at voltage supply conductors 15 and 35 and the voltage drop across transistors 51 and 52. Likewise, the supply voltage of multiplier core 34 depends on the supply voltage to multiplier 40 at voltage supply conductors 15 and 35 and the voltage drop across transistors 55 and 56. Unlike the conventional Gilbert multiplier, in which a cross-coupled pair and an emitter-coupled pair are serially coupled between the voltage supply conductors, the supply voltages of both transconductor 14 and multiplier core 34 can be individually adjusted. More particularly, transconductor 14 and multiplier core 34 can be biased with voltage values only slightly lower than the supply voltage to multiplier 40. Therefore, multiplier 40 can operate with a low supply voltage such as, for example, a supply voltage as low as approximately 1.8 volts. In other words, multiplier 40 is suitable for use in low voltage applications. The DC paths of transconductor 14 and the DC paths of multiplier core 34 are separated from each other by transistors 53 and 54, and the biasing of transconductor 14 and the biasing of multiplier core 34 are independent from each other. Further, transistors 53, 54, 55, and 56 are coupled in a cascode configuration that provides signal isolation between the collector electrodes and the emitter electrodes of transistors 53 and 54. Therefore, the signal isolation between the RF and LO ports is significantly improved over the signal isolation between the RF and LO ports in the conventional Gilbert multiplier.

Figure 3:
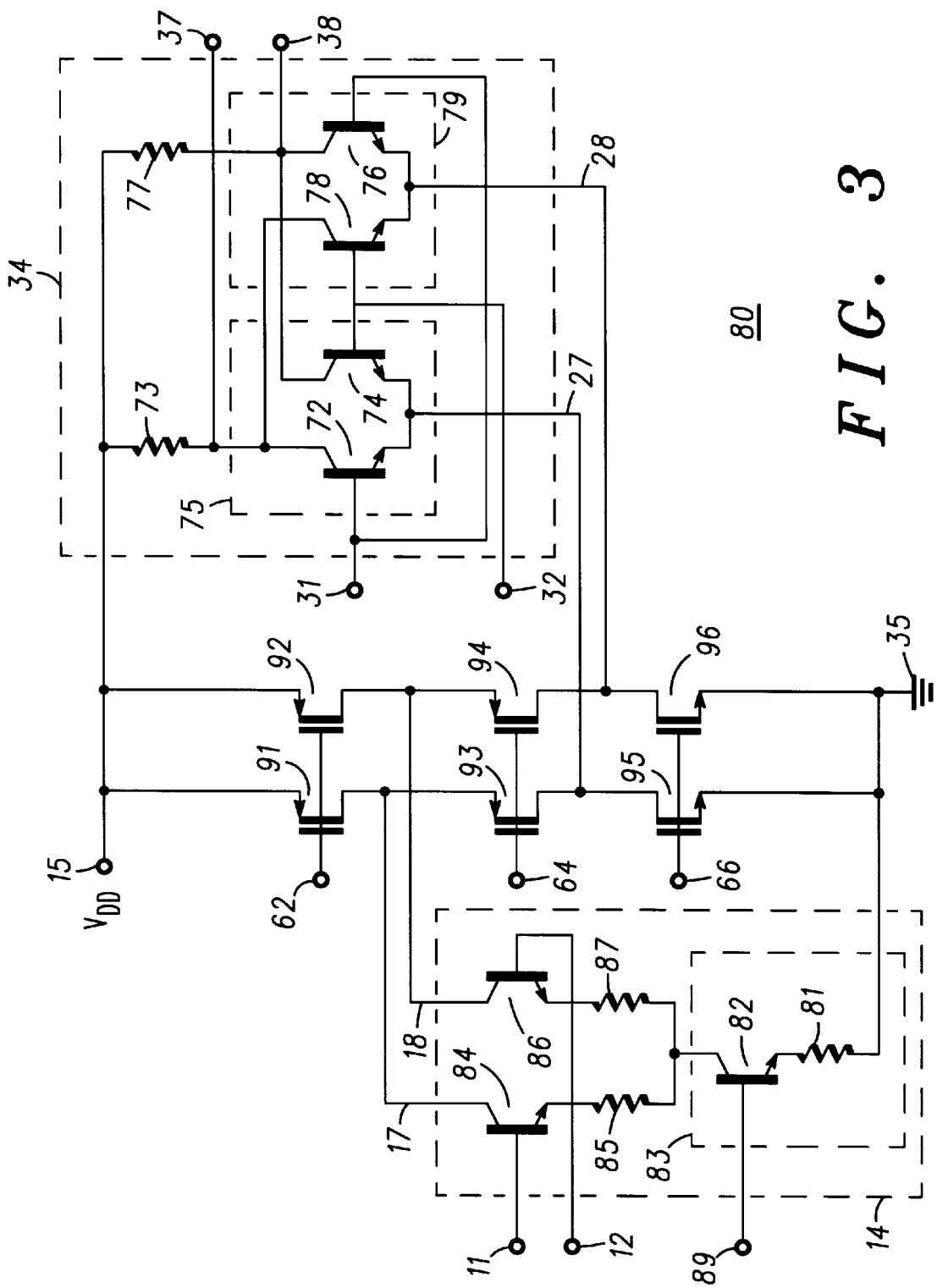
FIG. 3 is a schematic diagram of a multiplier in accordance with another embodiment of the present invention.

FIG. 3 is a schematic diagram of a multiplier 80 in accordance with another embodiment of the present invention. Like multiplier 10 shown in FIG. 1 and multiplier 40 shown in FIG. 2, multiplier 80 combines a differential RF input signal at a pair of differential RF input terminals 11 and 12 and a differential LO input signal at a pair of differential LO input terminals 31 and 32 to generate a differential output signal at a pair of differential output terminals 37 and 38. Multiplier 80 can operate as an analog multiplier such as an upconverter or a downconverter. Multiplier 80 can also operate as a modulator, a demodulator, or a phase detector.

Power is supplied to multiplier 80 via voltage supply conductors 15 and 35. By way of example, voltage supply conductor 15 is at an upper supply voltage level $V_{DD}$, and voltage supply conductor 35 is at a lower supply voltage level, e.g., ground voltage level. In low voltage applications, the upper supply voltage level $V_{DD}$ is typically between approximately 1.8 volts and approximately 3.3 volts.

Like multiplier 10 shown in FIG. 1, multiplier 80 includes a transconductor 14. Transconductor 14 is comprised of resistors 81, 85, and 87, and NPN bipolar transistors 82, 84, and 86. Resistor 81 and transistor 82 form a current source 83. A base electrode of transistor 82 is connected to a biasing terminal 89 for receiving a biasing signal for current source 83. A collector electrode of transistor 82 serves as a first terminal of current source 83. An emitter electrode of transistor 82 is connected to one electrode of resistor 81. Another electrode of resistor 81 serves as a second terminal of current source 83 and is connected to voltage supply conductor 35. A base electrode of transistor 84 serves as a first input of transconductor 14 and is connected to RF input terminal 11. An emitter electrode of transistor 84 is coupled to the collector electrode of transistor 82 via resistor 85. A collector electrode of transistor 84 is connected to output 17 of transconductor 14. A base electrode of transistor 86 serves as a second input of transconductor 14 and is connected to RF input terminal 12. An emitter electrode of transistor 86 is coupled to the collector electrode of transistor 82 via resistor 87. A collector electrode of transistor 86 is connected to output 18 of transconductor 14.

Transconductor 14 functions as a differential amplifier. It should be noted that transistors 82, 84, and 86 are not limited to being bipolar transistors. For example, they can be replaced by FETs. Resistors 85 and 87 function as emitter degeneration resistors to increase the linearity of transconductor 14. Preferably, the characteristics of transistors 84 and 86 match each other, and the resistance values of resistors 85 and 87 are substantially equal to each other. Resistor 81 functions as an emitter degeneration resistor to transistor 82 and serves to stabilize the characteristics of transistor 82 by providing a local feedback to transistor 82. It should be noted that resistors 81, 85, and 87 are optional in transconductor 14. The linearity of transconductor 14 can also be improved by using a predistortion circuit (not shown) to compensate for the nonlinear characteristics of transconductor 14.

Multiplier 80 also includes p-channel insulated gate FETs 91, 92, 93, and 94, and n-channel insulated gate FETs 95 and 96. The gate electrodes of FETs 91 and 92 are connected to biasing terminal 62 for receiving a biasing signal for FETs 91 and 92. The source electrodes of FETs 91 and 92 are connected to voltage supply conductor 15. The drain electrodes of FETs 91 and 92 are connected to outputs 17 and 18, respectively, of transconductor 14. The gate electrodes of FETs 93 and 94 are connected to biasing terminal 64 for receiving a biasing signal for FETs 93 and 94. The source electrodes of FETs 93 and 94 are connected to outputs 17 and 18, respectively, of transconductor 14. The gate electrodes of FETs 95 and 96 are connected to biasing terminal 66 for receiving a biasing signal for FETs 95 and 96. The source electrodes of FETs 95 and 96 are connected to voltage supply conductor 35. The drain electrodes of FETs 95 and 96 are connected to the drain electrodes of FETs 93 and 94, respectively.

FETs 91, 92, 93, 94, 95, and 96 perform functions similar to those of transistors 51, 52, 53, 54, 55, and 56, respectively, of multiplier 40 shown in FIG. 2. Preferably, the characteristics of FETs 92, 94, and 96 match the characteristics of FETs 91, 93, and 95, respectively. It should be noted that FETs 91, 92, 93, 94, 95, and 96 are not limited to being insulated gate FETs as shown in FIG. 3. They can be replaced by any kind of current source/sink circuit, which may include metal semiconductor FETs, bipolar transistors, insulated gate bipolar transistors, or the like. As those skilled in the art are aware, for a FET, the gate electrode serves as a control electrode, and the source and drain electrodes serve as current conducting electrodes. For example, in an alternative embodiment of the present invention, FETs 91 and 92 are replaced by PNP bipolar transistors. In another alternative embodiment, FETs 93 and 94 are replaced by PNP bipolar transistors. In yet another alternative embodiment, FETs 95 and 96 are replaced by NPN bipolar transistors. It should be noted that, when some FETs, e.g., FETs 95 and 96, in multiplier 80 are replaced by bipolar transistors, other FETs, e.g., FETs 91, 92, 93, and 94, in multiplier 80 may either remain as FETs or be replaced by bipolar transistors.

Multiplier 80 further includes a multiplier core 34. Multiplier core 34 includes NPN bipolar transistors 72, 74, 76, and 78, and resistors 73 and 77. An embodiment of multiplier core 34 has been described hereinbefore with reference to multiplier 40 shown in FIG. 2.

The operation of multiplier 80 is similar to the operation of multiplier 40 shown in FIG. 2. Like multiplier 40, multiplier 80 has six DC paths established between voltage supply conductors 15 and 35. The currents flowing through transconductor 14 and multiplier core 34 are independent from each other and can be individually adjusted to optimize the performance of multiplier 80. Unlike a conventional Gilbert multiplier, a larger current bias supplied to transconductor 14 does not necessarily increase the voltage swing of the output signal at output terminals 37 and 38. The supply voltage of transconductor 14 depends on the supply voltage to multiplier 80 at voltage supply conductors 15 and 35 and the voltage drop across FETs 91 and 92. Likewise, the supply voltage of multiplier core 34 depends on the supply voltage to multiplier 80 at voltage supply conductors 15 and 35 and the voltage drop across FETs 95 and 96. Unlike the conventional Gilbert multiplier, in which a cross-coupled pair and an emitter-coupled pair are serially coupled between the voltage supply conductors, the supply voltages of both transconductor 14 and multiplier core 34 can be individually adjusted. More particularly, transconductor 14 and multiplier core 34 can be biased with voltage values only slightly lower than the supply voltage to multiplier 80. Therefore, multiplier 80 can operate with a low supply voltage such as, for example, a supply voltage as low as approximately 1.8 volts. In other words, multiplier 80 is suitable for use in low voltage applications. The DC paths of transconductor 14 and the DC paths of multiplier core 34 are separated from each other by FETs 93 and 94, and the biasing of transconductor 14 and the biasing of multiplier core 34 are independent from each other. Further, FETs 93, 94, 95, and 96 form a folded cascode that provides signal isolation between the drain electrodes and the source electrodes of FETs 93 and 94. Therefore, the signal isolation between the RF and LO ports is significantly improved over the signal isolation between the RF and LO ports in the conventional Gilbert multiplier.

By now it should be appreciated that a multiplier and a method for mixing signals have been provided. The multiplier includes a transconductor and a multiplier core. In accordance with the present invention, the transconductor and the multiplier core have their current conduction paths separated from each other. The currents flowing in the transconductor and the multiplier core can be individually adjusted to optimize the performance of the multiplier. More particularly, a large current bias can be provided to the transconductor to improve the linearity of the multiplier without having to raise a supply voltage to the multiplier. Therefore, the multiplier is suitable for use in low voltage applications. Further, separate current conduction paths for the transconductor and the multiplier core improves the signal isolation between the RF and LO ports.

We claim:

1. A multiplier, comprising:

a transconductor having a pair of inputs and a pair of outputs;

a first current conducting element having a first terminal coupled to a first output of the pair of outputs of the transconductor, and a second terminal;

a second current conducting element having a first terminal coupled to a second output of the pair of outputs of the transconductor, and a second terminal;

a first current source coupled to the first terminal of the first current conducting element, wherein the first current source includes a first transistor having a control electrode coupled for receiving a first biasing signal, a first current conducting electrode coupled for receiving a first voltage, and a second current conducting electrode coupled to the first terminal of the first current conducting element;

a second current source coupled to the first terminal of the second current conducting element, wherein the second current source includes a second transistor having a control electrode coupled to the control electrode of the first transistor, a first current conducting electrode coupled to the first current conducting electrode of the first transistor, and a second current conducting electrode of the first transistor, and a second current conducting electrode coupled to the first terminal of the second current conducting element;

a first current sink coupled to the second terminal of the first current conducting element, wherein the first current sink includes a third transistor having a control electrode coupled for receiving a second biasing signal, a first current conducting electrode coupled for receiving a second voltage, and a second current conducting electrode coupled to the second terminal of the first current conducting element;

a second current sink coupled to the second terminal of the second current conducting element, wherein the second current sink includes a fourth transistor having a control electrode coupled to the control electrode of the third transistor, a first current conducting electrode coupled to the first current conducting electrode of the third transistor, and a second current conducting electrode coupled to the second terminal of the second current conducting element; and a multiplier core having a first pair of inputs, a second pair of inputs, and a pair of outputs, wherein a first input of the first pair of inputs is coupled to the second terminal of the first current conducting element and a second input of the first pair of inputs is coupled to the second terminal of the second current conducting element.

2. A multiplier, comprising:

a transconductor having a pair of inputs and a pair of outputs, wherein the transconductor includes:

a first transistor having a control electrode coupled to a first input of the pair of inputs of the transconductor, a first current conducting electrode, and a second current conducting electrode coupled to the first output of the pair of outputs of the transconductor;

a second transistor having a control electrode coupled to a second input of the pair of inputs of the transconductor, a first current conducting electrode, and a second current conducting electrode coupled to the second output of the pair of outputs of the transconductor;

a resistor having a first electrode coupled to the first current conducting electrode of the first transistor and a second electrode coupled to the first current conducting electrode of the second transistor;

a third current sink coupled to the first current conducting electrode of the first transistor; and a fourth current sink coupled to the first current conducting electrode of the second transistor;

a first current conducting element having a first terminal coupled to a first output of the pair of outputs of the transconductor, and a second terminal;

a second current conducting element having a first terminal coupled to a second output of the pair of outputs of the transconductor, and a second terminal;

a first current source coupled to the first terminal of the first current conducting element;

a second current source coupled to the first terminal of the second current conducting element;

a first current sink coupled to the second terminal of the first current conducting element;

a second current sink coupled to the second terminal of the second current conducting element; and a miltiplier core having a first pair of inputs, a second pair of inputs, and a pair of outputs, wherein a first input of the first pair of inputs is coupled to the second terminal of the first current conducting element and a second input of the first pair of inputs is coupled to the second terminal of the second current conducting element.

3. The multiplier of claim 2, wherein:

the first current conducting element includes a first transistor having a control electrode coupled for receiving a biasing signal, a first current conducting electrode coupled to the first terminal of the first current conducting element, and a second current conducting electrode coupled to the second terminal of the first current conducting element; and a second current conducting element includes a second transistor having a control electrode coupled to the control electrode of the first transistor, a first current conducting electrode coupled to the first terminal of the second current conducting element, and a second current conducting electrode coupled to the second terminal of the second current conducting element.

4. A multiplier, comprising:

a transconductor having a pair of inputs and a pair of outputs;

a first current conducting element having a first terminal coupled to a first output of the pair of outputs of the transconductor, and a second terminal;

a second current conducting element having a first terminal coupled to a second output of the pair of outputs of the transconductor, and a second terminal;

a first current source coupled to the first terminal of the first current conducting element;

a second current source coupled to the first terminal of the second current conducting element;

a first current sink coupled to the second terminal of the first current conducting element;

a second current sink coupled to the second terminal of the second current conducting element; and a multiplier core having a first pair of inputs, a second pair of inputs, and a pair of outputs, wherein a first input of the first pair of inputs is coupled to the second terminal of the first current conducting element and a second input of the first pair of inputs is coupled to the second terminal of the second current conducting element and wherein the multiplier core includes:

a first transistor having a control electrode coupled to a first input of the second pair of inputs of the multiplier core, a first current conducting electrode coupled to the first input of the first pair of inputs of the multiplier core, and a second current conducting electrode coupled to a first output of the pair of outputs of the multiplier core;

a second transistor having a control electrode coupled to a second input of the second pair of inputs of the multiplier core, a first current conducting electrode coupled to the first current conducting electrode of the first transistor, and a second current conducting electrode coupled to a second output of the pair of outputs of the multiplier core;

a third transistor having a control electrode coupled to the control electrode of the first transistor, a first current conducting electrode coupled to the second input of the first pair of inputs of the multiplier core, and a second current conducting electrode coupled to the second current conducting electrode of the second transistor; and a fourth transistor having a control electrode coupled to the control electrode of the second transistor, a first current conducting electrode coupled to the first current conducting electrode of the third transistor, and a second current conducting electrode coupled to the second current conducting electrode of the first transistor.

5. The multiplier of claim 4, wherein the multiplier core further includes:

a third current conducting element having a first terminal coupled for receiving a voltage and a second terminal coupled to the second current conducting electrode of the first transistor; and a fourth current conducting element having a first terminal coupled to the first terminal of the third current conducting element and a second terminal coupled to the second current conducting electrode of the second transistor.

6. The multiplier of claim 5, wherein the third current conducting element and the fourth current conducting element are resistors.

7. A multiplier having a pair of differential radio frequency (RF) input terminals, a pair of differential local oscillator (LO) input terminals, and a pair of differential output terminals, comprising:

a differential amplifier having a first input coupled to a first RF input terminal of the pair of differential RF input terminals, a second input coupled to a second RF input terminal of the pair of differential RF input terminals, a first output, and a second output;

a first transistor having a control electrode coupled for receiving a first biasing signal, a first current conducting electrode coupled to the first output of the differential amplifier, and a second current conducting electrode;

a second transistor having a control electrode coupled to the control electrode of the first transistor, a first current conducting electrode coupled to the second output of the differential amplifier, and a second current conducting electrode;

a first current source having a first terminal coupled for receiving a first voltage and a second terminal coupled to the first current conducting electrode of the first transistor;

a second current source having a first terminal coupled to the first terminal of the first current source and a second terminal coupled to the first current conducting electrode of the second transistor;

a third current source having a first terminal coupled to the second current conducting electrode of the first transistor and a second terminal coupled for receiving a second voltage;

a fourth current source having a first terminal coupled to the second current conducting electrode of the second transistor and a second terminal coupled to the second terminal of the third current source;

a first differential pair having a first input coupled to a first LO input terminal of the pair of differential LO input terminals, a second input coupled to a second LO input terminal of the pair of differential LO input terminals, a first output coupled to a first output terminal of the pair of differential output terminals, a second output coupled to a second output terminal of the pair of differential output terminals, and a current biasing terminal coupled to the second current conducting electrode of the first transistor;

a second differential pair having a first input coupled to the first LO input terminal, a second input coupled to the second LO input terminal, a first output coupled to the second output terminal, a second output coupled to the first output terminal, and a current biasing terminal coupled to the second current conducting electrode of the second transistor;

a first load having a first terminal coupled to the first terminal of the first current source and a second terminal coupled to the first output terminal; and a second load having a first terminal coupled to the first terminal of the first load and a second terminal coupled to the second output terminal.

8. The multiplier of claim 7, wherein the first transistor and the second transistor are transistors selected from the group consisting of p-channel insulated gate field effect transistors and PNP bipolar transistors.

9. The multiplier of claim 7, wherein:

the first current source includes a third transistor having a control electrode coupled for receiving a second biasing signal, a first current conducting electrode coupled to the first terminal of the first current source, and a second current conducting electrode coupled to the second terminal of the first current source;

the second current source includes a fourth transistor having a control electrode coupled to the control electrode of the third transistor, a first current conducting electrode coupled to the first terminal of the second current source, and a second current conducting electrode coupled to the second terminal of the second current source;

the third current source includes a fifth transistor having a control electrode coupled for receiving a third biasing signal, a first current conducting electrode coupled to the second terminal of the third current source, and a second current conducting electrode coupled to the first terminal of the third current source; and the fourth current source includes a sixth transistor having a control electrode coupled to the control electrode of the fifth transistor, a first current conducting electrode coupled to the second terminal of the fourth current source, and a second current conducting electrode coupled to the first terminal of the fourth current source.

10. The multiplier of claim 9, wherein:

the third transistor and the fourth transistor are transistors selected from the group consisting of p-channel insulated gate field effect transistors and PNP bipolar transistors; and the fifth transistor and the sixth transistor are transistors selected from the group consisting of n-channel insulated gate field effect transistors and NPN bipolar transistors.

11. The multiplier of claim 7, wherein the differential amplifier includes:

a third transistor having a control electrode coupled to the first input of the differential amplifier, a first current conducting electrode, and a second current conducting electrode coupled to the first output of the differential amplifier;

a fourth transistor having a control electrode coupled to the second input of the differential amplifier, a first current conducting electrode, and a second current conducting electrode coupled to the second output of the differential amplifier;

a first resistor having a first electrode coupled to the first current conducting electrode of the third transistor, and a second electrode;

a second resistor having a first electrode coupled to the first current conducting electrode of the fourth transistor and a second electrode coupled to the second electrode of the first resistor; and a fifth current source having a first terminal coupled to the second electrode of the first resistor and a second terminal coupled to the second terminal of the third current source.

12. The multiplier of claim 11, wherein the fifth current source includes:

a fifth transistor having a control electrode coupled for receiving a second biasing signal, a first current conducting electrode, and a second current conducting electrode coupled to the first terminal of the fifth current source; and a third resistor having a first electrode coupled to the first current conducting electrode of the fifth transistor and a second electrode coupled to the second terminal of the fifth current source.

13. The multiplier of claim 7, wherein:

the first differential pair includes:

a third transistor having a control electrode coupled to the first input of the first differential pair, a first current conducting electrode coupled to the current biasing terminal of the first differential pair, and a second current conducting electrode coupled to the first output of the first differential pair; and a fourth transistor having a control electrode coupled to the second input of the first differential pair, a first current conducting electrode coupled to the current biasing terminal of the first differential pair, and a second current conducting electrode coupled to the second output of the first differential pair; and the second differential pair includes:

a fifth transistor having a control electrode coupled to the first input of the second differential pair, a first current conducting electrode coupled to the current biasing terminal of the second differential pair, and a second current conducting electrode coupled to the first output of the second differential pair; and a sixth transistor having a control electrode coupled to the second input of the second differential pair, a first current conducting electrode coupled to the current biasing terminal of the second differential pair, and a second current conducting electrode coupled to the second output of the second differential pair.

14. The multiplier of claim 7, wherein the first load and the second load are resistors.

15. A method for mixing signals, comprising the steps of:

establishing a first current conduction path from a first supply voltage to a second supply voltage via a first current source and a transconductor;

establishing a second current conduction path from the first supply voltage to the second supply voltage via the first current source, a first transistor, and a first current sink;

establishing a third current conduction path from the first supply voltage to the second supply voltage via a multiplier core and the first current sink;

transmitting a first input signal to the transconductor to generate a first current signal;

modulating a first quiescent current in the first transistor in accordance with the first current signal to generate a second current signal; and combining the second current signal and a second input signal in the multiplier core to generate an output signal.

16. The method of claim 15, further comprising the steps of:

establishing a fourth current conduction path from the first supply voltage to the second supply voltage via a second current source and the transconductor;

establishing a fifth current conduction path from the first supply voltage to the second supply voltage via the second current source, a second transistor, and a second current sink; and establishing a sixth current conduction path from the first supply voltage to the second supply voltage via the multiplier core and the second current sink.

17. The method of claim 16, wherein:

the step of transmitting a first input signal includes the steps of:

selecting a differential radio frequency (RF) signal as the first input signal;

generating a first signal component of the first current signal from a first signal component of the differential RF signal; and generating a second signal component of the first current signal from a second signal component of the differential RF signal;

the step of modulating a first quiescent current includes the steps of:

modulating the first quiescent current in the first transistor in accordance with the first signal component of the first current signal to generate a first signal component of the second current signal; and modulating a second quiescent current in the second transistor in accordance with the second signal component of the first current signal to generate a second signal component of the second current signal; and the step of combining the second current signal and the second input signal includes the steps of:
  selecting a differential local oscillator (LO) signal as the second input signal; and
  generating a differential current signal by combining the second current signal and the differential LO signal.

18. The method of claim 17, further comprising the steps of:
  generating a first voltage signal from a first signal component of the differential current signal, the first voltage signal serving as a first signal component of the output signal; and
  generating a second voltage signal from a second signal component of the differential current signal, the second voltage signal serving as a second signal component of the output signal.

19. The method of claim 18, wherein:
  the step of generating a first voltage signal includes passing the first signal component of the differential current signal through a first load; and
  the step of generating a second voltage signal includes passing the second signal component of the differential current signal through a second load.

* * * * *